(12) United States Patent
Blanchard et al.

(10) Patent No.: US 11,753,712 B2
(45) Date of Patent: Sep. 12, 2023

(54) DURABLE ELECTROCHROMIC DEVICE INCLUDING TUNGSTEN OXIDE FILM PREPARED IN HIGH ION BOMBARDMENT AND LOW PRESSURE DEPOSITION ENVIRONMENT, AND/OR METHODS OF MAKING THE SAME

(71) Applicant: Essilor International, Charenton-le-Pont (FR)

(72) Inventors: Francis Blanchard, Blainville (CA); Bill Baloukas, Montreal (CA); Ludvik Martinu, Montreal (CA)

(73) Assignee: Essilor International, Charenton-le-pont (FR)

( * ) Notice: Subject to any disclaimer, the term of this patent is extended or adjusted under 35 U.S.C. 154(b) by 409 days.

(21) Appl. No.: 16/645,261

(22) PCT Filed: Sep. 8, 2017

(86) PCT No.: PCT/US2017/050621
§ 371 (c)(1),
(2) Date: Mar. 6, 2020

(87) PCT Pub. No.: WO2019/050530
PCT Pub. Date: Mar. 14, 2019

(65) Prior Publication Data
US 2020/0301233 A1 Sep. 24, 2020

(51) Int. Cl.
*C23C 14/34* (2006.01)
*G02F 1/1524* (2019.01)
(Continued)

(52) U.S. Cl.
CPC ............ *C23C 14/345* (2013.01); *C23C 14/08* (2013.01); *G02F 1/1524* (2019.01); *G02F 1/1525* (2013.01); *G02F 2202/36* (2013.01)

(58) Field of Classification Search
CPC ...... C23C 14/345; C23C 14/08; G02F 1/1524; G02F 1/1525; G02F 2202/36; G02F 1/1523
See application file for complete search history.

(56) References Cited

U.S. PATENT DOCUMENTS 4,303,310 A * 12/1981 Morita ................. G02F 1/1524
359/266
5,189,550 A 2/1993 Goldner et al.
(Continued)

FOREIGN PATENT DOCUMENTS

JP 2003248920 A * 9/2003

OTHER PUBLICATIONS

Wang, et al., Effect of negative bias on the composition and structure of the tungsten oxide thin films deposited by magnetron sputtering, 2015, Applied Surface Science, 359, 521-525 (Year: 2015).*

(Continued)

*Primary Examiner* — Jennifer Wecker
*Assistant Examiner* — Patrick S Ott
(74) *Attorney, Agent, or Firm* — Oblon, McClelland, Maier & Neustadt, L.L.P.

(57) ABSTRACT

Certain example embodiments of this invention relate to electrochromic devices (100, 1500), assemblies incorporating electrochromic devices, and methods of making the same. Highly-durable electrochromic devices include tungsten oxide (e.g., $WO_3$ or other suitable stoichiometry) films (102, 1510) prepared using high-rate bias-enhanced sputter deposition. The sputtering is performed in a low-pressure (e.g., 1 mTorr) environment, and the biasing is very high (e.g., greater than −400 V, more preferably greater than −500 V), which causes high energy ion bombardment that in turn leads to partial nanocrystallization of the $WO_3$ matrix, while (Continued)

simultaneously generating the porous microstructure desirable for ionic diffusion.

19 Claims, 14 Drawing Sheets

(51) Int. Cl.
  *C23C 14/08* (2006.01)
  *G02F 1/1523* (2019.01)

(56) References Cited

U.S. PATENT DOCUMENTS

| | | | |
|---|---|---|---|
| 6,077,621 A * | 6/2000 | Allen | C25B 9/23 134/1 |
| 7,190,506 B1 | 3/2007 | Berneth et al. | |
| 7,375,871 B2 | 5/2008 | Libretto et al. | |
| 7,411,716 B2 | 8/2008 | Oh et al. | |
| 7,450,294 B2 | 11/2008 | Weidner | |
| 7,511,872 B2 | 3/2009 | Tonar et al. | |
| 7,525,714 B2 | 4/2009 | Poll et al. | |
| 7,545,551 B2 | 6/2009 | Yoshimura et al. | |
| 7,547,658 B2 | 6/2009 | Liu et al. | |
| 8,158,880 B1 * | 4/2012 | Girt | H01L 31/075 257/431 |
| 8,289,610 B2 | 10/2012 | Veerasamy | |
| 8,638,487 B2 | 1/2014 | Veerasamy | |
| 8,858,748 B2 | 10/2014 | Veerasamy | |
| 9,140,950 B2 | 9/2015 | Veerasamy | |
| 10,948,628 B1 * | 3/2021 | Demiryont | G02F 1/155 |
| 2006/0209383 A1 * | 9/2006 | Burdis | G02F 1/1524 359/265 |
| 2011/0011460 A1 * | 1/2011 | Munteanu | C23C 14/3492 136/265 |

OTHER PUBLICATIONS

JP-2003248920-A Translation (Year: 2003).*
Granqvist, Electrochromic tungsten oxide films: Review of progress 1993-1998, 2000, Solar Energy Materials and Solar Cells, vol. 60 Issue 3, p. 201-262 (Year: 2000).*
International Search Report dated May 15, 2018 in PCT/US2017/050621 filed Sep. 8, 2017.
E. Avendaño, et al., "Electrochromic materials and devices: Brief survey and new data on optical absorption in tungsten oxide and nickel oxide films," Thin Solid Films, vol. 496, No. 1, XP025006723, 2006, pp. 30-36 (with Abstract).
Po-Kai Chiu, et al., "Investigation of the Microstructure, Porosity, Adhesion, and Optical Properties of a $WO_3$ Film Fabricated Using an E-Beam System With Ion Beam-Assisted Deposition," IEEE Transactions on Magnetics, vol. 50, No. 7, XP011552971, Jul. 2014, 4 Pages (with Abstract).
Hari Krishna, K et al. "Electrochromic properties of nanocrystalline WO3 thin films grown on flexible substrates by plasma-assisted evaporation technique", Applied Physics A; Materials Science & Processing, Springer, Berlin, DE, vol. 99, No. 4, Apr. 15, 2010 (Apr. 15, 2010), pp. 921-929.

* cited by examiner

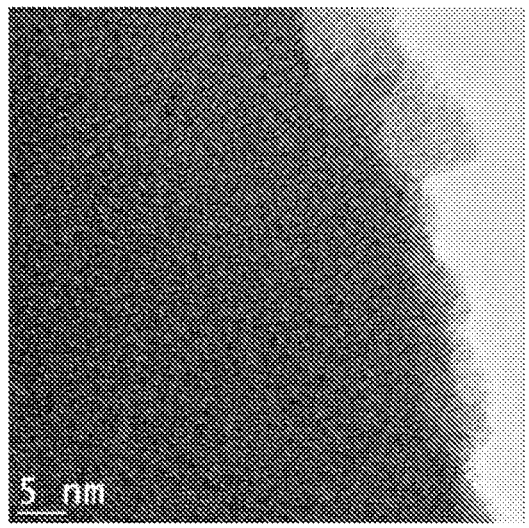 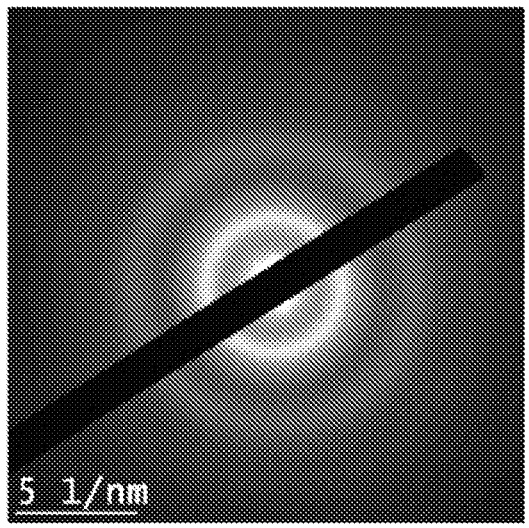
Fig. 13a  Fig. 13b
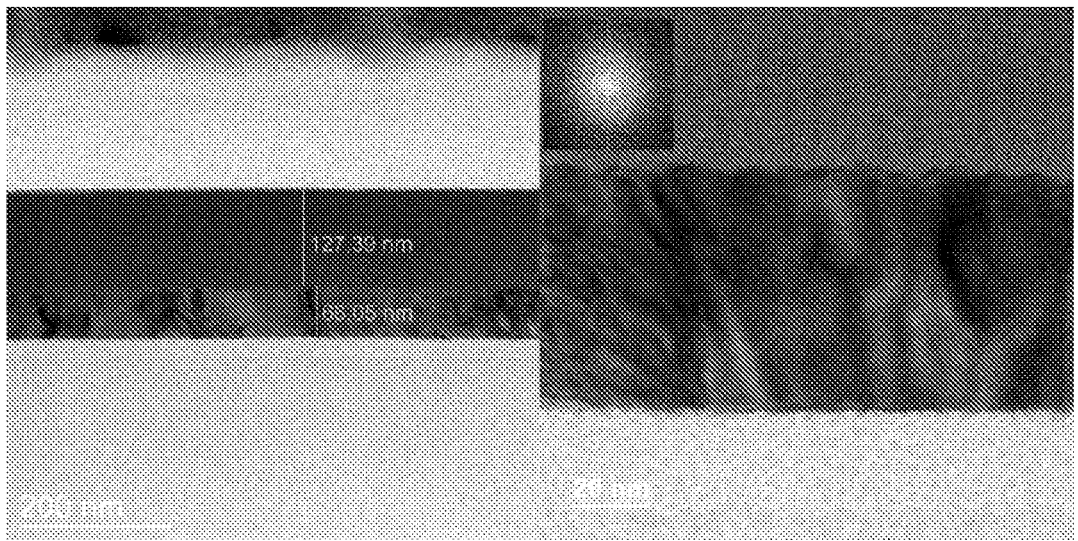
Fig. 14a  Fig. 14b

DURABLE ELECTROCHROMIC DEVICE INCLUDING TUNGSTEN OXIDE FILM PREPARED IN HIGH ION BOMBARDMENT AND LOW PRESSURE DEPOSITION ENVIRONMENT, AND/OR METHODS OF MAKING THE SAME

TECHNICAL FIELD

Certain example embodiments of this invention relate to electrochromic (EC) devices, assemblies incorporating electrochromic devices, and/or methods of making the same. More particularly, certain example embodiments of this invention relate to highly-durable electrochromic devices including tungsten oxide (e.g., $WO_3$ or other suitable stoichiometry) films prepared using high-rate bias-enhanced sputter deposition, and/or methods of making the same.

BACKGROUND AND SUMMARY

The building sector is known for its high energy consumption, which has been shown to represent 30-40% of the world's primary energy expenditure. Operational costs, such as heating, cooling, ventilation, and lighting account for the better part of this consumption, especially in older structures built under less stringent energy efficiency construction standards.

Windows, for example, provide natural light, fresh air, access, and connection to the outside world. However, they oftentimes also represent a significant source of wasted energy. With the growing trend in increasing the use of architectural windows, balancing the conflicting interests of energy efficiency and human comfort is becoming more and more important. Furthermore, concerns with global warming and carbon footprints are adding to the impetus for novel energy efficient glazing systems.

In this regard, because windows are usually the "weak link" in a building's isolation, and considering modern architectural designs that often include whole glass facades, it becomes apparent that having better insulating windows would be advantageous in terms of controlling and reducing energy waste. There are, therefore, significant advantages both environmentally and economically in developing highly insulating windows.

Windows are unique elements in most buildings in that they have the ability to "supply" energy to the building in the form of winter solar gain and daylight year around. Current window technology, however, often leads to excessive heating costs in winter, excessive cooling in summer, and often fails to capture the benefits of daylight, that would allow lights to be dimmed or turned off in much of the nation's commercial stock.

Thin film technology is one promising way of improving window performance. Thin films can, for example, be applied directly onto glass during production, on a polymer web that can be retrofitted to an already pre-existing window at correspondingly lower cost, etc. And advances have been made over the last two decades, primarily in reducing the U-value of windows through the use of static or "passive" low-emissivity (low-E) coatings, and by reducing the solar heat gain coefficient (SHGC) via the use of spectrally selective low-E coatings. However, further enhancements are still possible.

With the ability to dynamically control solar heat gain, loss, and glare without blocking the view, electrochromic windows (ECWs or EC windows) may provide a significant reduction in energy use. Indeed, ECWs have the potential to impact all the window energy end uses, e.g., by reducing cooling loads in climates where windows contribute to substantial cooling loads while allowing the same window to admit solar gain in winter to reduce heating, and modulating daylight to allow electric lighting to be reduced in commercial buildings while also controlling glare. For example, as the exterior light and heat levels change, the performance of the window can be automatically adjusted to suit conditions via an automated feedback control.

Electrochromic (EC) windows are known. See, for example, U.S. Pat. Nos. 7,547,658; 7,545,551; 7,525,714; 7,511,872; 7,450,294; 7,411,716; 7,375,871; and 7,190,506, the disclosure of each of which is incorporated herein by reference. EC "smart" windows oftentimes include a layer comprising $WO_3$. Both the characteristic change in optical properties upon the voltage-driven ion and electron insertion and the reversibility of the coloration process allow for direct control of the amount of visible and near-infrared light that can pass through a window. Going from passive to active in this manner makes it possible to achieve both a higher level of comfort for the user and a better control over energy expenditures.

Some current EC dynamic windows provide transmissions ranging from about 3% in the tinted state to about 70% in the clear state. Moreover, the solar heat gain control (SHGC) range is quite large. Indeed, some current EC dynamic windows provide an SHGC range from about 0.09 in the tinted to about 0.48 in the clear state. Lithium based-inorganic EC technology also offers the advantages of durability, low voltage (less than about 5V) operation, clarity (70%), transparency when power is off (e.g., if so configured), and low energy consumption. Despite these broad ranges, current lithium-based inorganic ECWs unfortunately offer limited color variation, and maximum opacity could be improved (e.g., relative to other switchable glazing types). Another drawback with current lithium-based inorganic ECWs can relate to their slow switching times. Indeed, current switching times for lithium-based inorganic ECWs typically range from about 5-10 minutes. Proton-based inorganic and organic polymer device mechanisms switch somewhat faster (e.g., 15 seconds to 5 minutes) but unfortunately suffer from degradation of the ionic conductor in the former case and degradation of the polymer in the latter case. The operational voltage for lithium based inorganic as well as proton-based inorganic and organic polymer type EC devices typically operate with 1-5 V DC and typically consume 2-3 $W/m^2$ when switching and 0.5-1 $W/m^2$ while maintaining the tinted state. Slow switching times can be of an even larger concern in other application such as, for example, ophthalmic applications.

FIG. 1a is a schematic diagram of a typical electrochromic window or other device, and FIG. 1b is a schematic diagram of a typical electrochromic window in a tinted or colored state. (It is understood that the incident, transmitted, and reflected fluxes are not drawn to scale and that there may be at least some absorption, e.g., when it comes to heat.) The active stack 100 shown in FIG. 1a includes four components, namely, first and second transparent current collectors 106 and 110; a cathode 102 (and often the coloration layer); an electrolyte 108 (which is ionically conducting but electrically insulating); and an anode 104, which is the source of the active ions (e.g. H, Li, Na, etc.) that switch the glazing properties upon transfer to and from the anode (ion reservoir). The anode 104 may also be a coloration layer, if coloration occurs anodically, e.g., as ions exit the layer. These components are sandwiched between first and second glass substrates 112 and 114. Fundamentally, the electrochromic device dynamically changes optical absorptivity, with the movement (intercalation and de-intercalation) of the ions into and out of the cathode 106. This, in turn, modulates the interaction with solar radiation thereby modulating the SHGC for energy control, as well as visibility and glare (important for human comfort). Because the ions are in the cathode 102, the electrochromic window in a tinted or colored state and only a portion of incident light and heat are transmitted through the ECW.

The entire contents of each of U.S. Pat. Nos. 9,140,950; 8,858,748; 8,638,487; and 8,289,610 is hereby incorporated by reference herein. These patents discuss improvements with respect to performance in appearance (including color), switching speed, quality consistency, and long term reliability. These patents also address improved EC device fabrication manufacturing and durability concerns.

Ensuring long-term durability of the EC material has been of major concern and subject of multiple studies. Studies have shown that the use of nanocrystalline $WO_3$ can solve the problem of chemical stability, while maintaining or improving its EC properties over amorphous films. Unfortunately, however, the fabrication of such nanocrystalline films often requires multiple steps and is often based on chemically-based processes such as sol-gel and HWCVD (hot-wire chemical vapor deposition) processes, making them somewhat harder to implement both from technical and environmental standpoints, especially when it comes to large-scale industrial applications. Furthermore, the durability of EC films oftentimes is negatively affected by structural changes and side reactions during repetitive charging and discharging (related to the intercalation of ions), especially in implementations where H ions are used. These structural changes and side reactions can, in turn, lead to etching-like effects, gas formation, and slow loss of EC activity. In addition, EC films typically are fabricated using reactive magnetron sputtering at high deposition pressures, which helps obtain a porous microstructure that allows for easier ion intercalation and, as a result, the deposition rates are typically slow.

Thus, it will be appreciated that there is a need in the art for improved electrochromic dynamic windows and other electrochromic devices, and/or methods of making the same. In this regard, certain example embodiments help address the need for high-durability EC windows and other EC devices, industrially-scalable EC window and other EC device fabrication techniques, etc.

One aspect of certain example embodiments relate to a single-step fabrication approach in the context of EC $WO_3$ materials. Certain example embodiments apply substrate biasing during RF sputtering of $WO_3$, even though doing so is known to lead to densification and thus, a priori, is seen as being generally detrimental to EC materials. As explained in greater detail below, although this "conventional wisdom" is indeed the case for films deposited at low pressure (e.g., 1 mTorr) using low bias voltages (e.g., under 400 V), when surpassing a specific threshold voltage (e.g., >400 V in the present case), the resulting films surprisingly and unexpectedly are shown to regain their EC activity and possess a surprisingly high long-term electrochemical and microstructural durability. The resulting thin films' EC performance are compared to their non-biased counterparts and typical porous $WO_3$ films deposited at higher pressures (20 mTorr) by performing electrochemical ion insertion via cyclic voltammetry. Extensive structural and physical analyses of the samples are performed, and the formation of a composite porous amorphous/nanocrystalline structure responsible for the observed enhanced EC performance is demonstrated.

In certain example embodiments, a method of making an electrochromic device is provided. An electrical bias of at least −400 V is applied to a substrate. During application of the electrical bias to the substrate, an EC film comprising tungsten oxide is sputter-deposited on the substrate. The sputter deposition is performed in an environment at a pressure less than 5 mTorr, and the application of the electrical bias is performed to promote energetic ion bombardment during the sputter deposition, in making the EC device. The as-deposited EC film comprising tungsten oxide is, at least partially, nanocrystalline.

In certain example embodiments, a method of making an electrochromic window or an electrochromic device is provided. A first transparent conductive coating (TCC) is formed, directly or indirectly, on a glass substrate. A plurality of EC device layers are formed directly or indirectly on the first TCC, with the EC device layers including a counter electrode (CE) layer, an ion conductor (IC) layer directly or indirectly on the CE layer, and an EC film directly or indirectly on the IC layer. A second TCC is formed, directly or indirectly, on an uppermost layer of the EC device layers. The EC film comprises tungsten and oxygen and is formed by sputter deposition at a low pressure of less than 2 mTorr while the substrate is biased with a voltage of at least −400 V. The as-deposited EC film has a pseudo-porous nanostructure with a packing density less than about 85%.

In certain example embodiments, an electrochromic device comprises: a substrate; a first TCC formed, directly or indirectly, on the substrate; a plurality of EC device layers formed directly or indirectly on the first TCC, the EC device layers including a counter electrode layer, an ion conductor layer directly or indirectly on the CE layer, and an EC film directly or indirectly on the IC layer; and a second TCC formed, directly or indirectly, on an uppermost layer of the EC device layers. The EC film comprises tungsten and oxygen and is formed by sputter deposition at a pressure less above vacuum but less than 2 mTorr while the substrate is biased with a voltage of at least −400 V. The as-deposited EC film is at least partially nanocrystalline and has a pseudo-porous nanostructure with a packing density less than about 85%.

In certain example embodiments, a method of making an EC device comprises forming, on a substrate, an EC film in an environment at a pressure less than 5 mTorr, the EC film being formed under promoted energetic ion bombardment conditions, in making the EC device. The forming may be practiced in connection with an ion beam, e.g., in the case of ion beam assisted magnetron or ion beam sputtering; ion beam assisted evaporation; and/or the like. The forming alternatively or additionally may be practiced in connection with laser beam assisted magnetron sputtering, ion beam sputtering, evaporation, and/or the like. As still another alternative or addition, the forming may be practiced in connection with negative biasing of the substrate. The as-deposited EC film may comprise tungsten oxide, nickel oxide, and/or other suitable materials. In certain example embodiments, the as-deposited EC film may comprise a discrete stratum of amorphous EC material under a discrete stratum of crystalline EC material.

In certain example embodiments, a method of making an EC device is provided and comprises depositing on a substrate, under promoted energetic ion bombardment comprising ions with an energy of at least 400 eV, an EC film comprising tungsten oxide, with the deposition being performed in an environment at a pressure less than 5 mTorr, in making the EC device. The as-deposited EC film comprising tungsten oxide is at least partially nanocrystalline. The promoted energetic ion bombardment is a method selected from ion assisted evaporation processes and ion beam deposition processes.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which:

FIG. 13a is a TEM image of the scratched-off 1 mTorr $WO_3$ film on a Si substrate, and FIG. 13b is the corresponding SAED image;

FIG. 14a is a TEM image of the 1 mTorr $WO_3$ film on ITO, and FIG. 14b is the corresponding SAED image

DETAILED DESCRIPTION

Figure 1A:
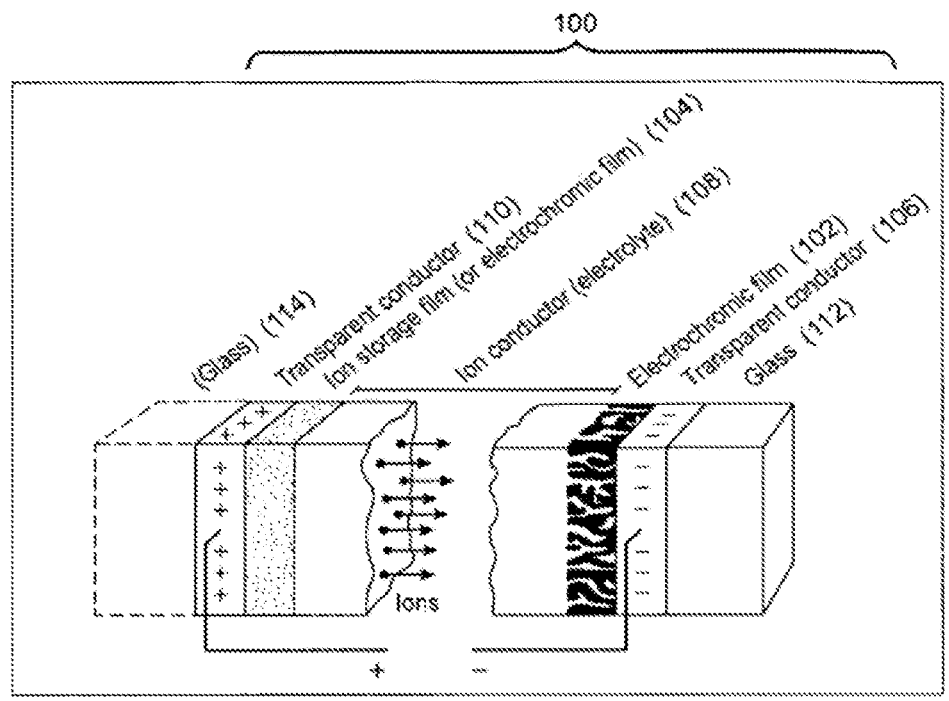
FIG. 1a is a schematic diagram of a typical electrochromic window or other electrochromic device.
Figure 1B:
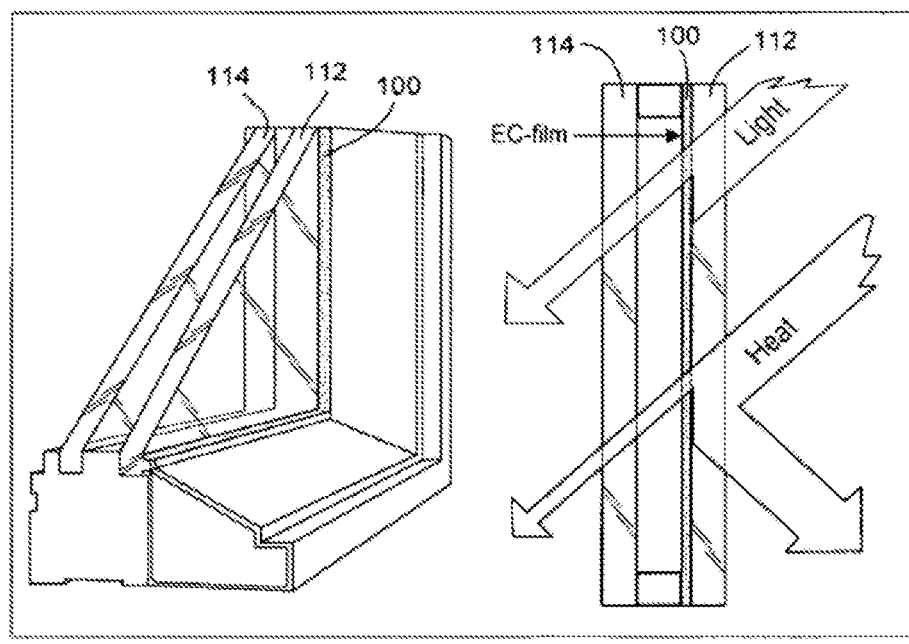
FIG. 1b is a schematic diagram of a typical electrochromic window in a tinted or colored state.

Electrochromic (EC) materials represent numerous potential applications including, for example, for use in smart windows for increased energy efficiency, optical devices such as switchable mirrors, anti-counterfeiting devices, ophthalmic lenses, head-mounted devices, sensors and others, but, as noted above, their long-term durability remains an issue for widespread implementation and commercialization. The instant disclosure compares "traditional" RF magnetron-sputtered porous $WO_3$ films produced at high pressures (20 mTorr) with films deposited at lower pressures (1 mTorr) under energetic ion bombardment due to intense substrate biasing. As demonstrated below, at and above a specific threshold substrate bias voltage (e.g., above 400 V, more preferably at about 500 V), the films show not only comparable EC properties and coloration efficiencies, but they also present an exceptional long-term durability in a 0.1 M $H_2SO_4$ electrolyte and are deposited many times (e.g., five times) faster. That is, an EC film comprising tungsten oxide using low pressure and high substrate biasing was formed faster compared to a situation where an EC film comprising tungsten oxide was sputtered at 20 mTorr pressure and without electrical biasing. The observed performance increase is believed to be attributable to the impact of the high energy ion bombardment that leads to partial nanocrystallization of the $WO_3$ matrix, while simultaneously generating the porous microstructure necessary and desirable for ionic diffusion. This improved fabrication approach may in some instances lead to a cost-effective fabrication of highly durable EC devices.

Sample Setup

Sample thin films comprising $WO_3$ were prepared by RF magnetron sputtering in a CMS-18 system acquired from the Kurt J. Lesker Company and fitted with a 3-inch diameter $WO_3$ target (99.9% purity, Kurt J. Lesker Company). The base pressure in the system was lower than $9 \times 10^{-8}$ Torr prior to inserting the samples through a load-lock system. Argon and oxygen were introduced through mass-flow controllers at a 20% $O_2$/Ar ratio. The discharge power was kept constant for all samples at 438 W (9.6 W/cm$^2$). Substrates for electrochemical analyses included 2.5×5 cm ITO-coated glass with a sheet resistance of 30 ohms/square (Delta Technologies) and were cleaned with isopropanol, rinsed with deionized water, and then dried in nitrogen. Additional crystalline Si (100) substrates were used for complementary characterization and analyses.

Previous work showed that 20 mTorr was the optimal pressure for the fabrication of porous amorphous $WO_3$ films, achieving EC properties on par with the literature. However, to the contrary, in connection with the experiments described herein, substrate biasing (13.56 MHz RF SEREN power supply) was applied. The samples were prepared at both 20 mTorr and 1 mTorr with biasing up to −525 V in order to directly compare their EC performance; for comparison, a control sample was also produced at 1 mTorr without biasing (floating potential). Lower bias voltages were also tested; however, as expected, the EC performance decreased with increasing bias up to a threshold voltage of approximately −400 V such as in the present case. Table 1 summarizes the main deposition conditions of the samples.

TABLE 1

Deposition parameters for WO₃ thin films deposited by RF magnetron sputtering.

| Sample | Pressure (mTorr) | Substrate bias (V) | Target Power (W) | Target Voltage (V) | Layer Thickness (nm) | Deposition time (s) | Deposition rate (Å/s) |
|---|---|---|---|---|---|---|---|
| 1 | 20 | 0 | 438 | 107 | 136 | 5500 | 0.25 |
| 2 | 1 | 0 | 438 | 200 | 133 | 875 | 1.5 |
| 3 | 1 | −525 | 438 | 201 | 137 | 1050 | 1.3 |

The deposition rate for samples sputtered at low pressure was vastly increased when compared to the high-pressure samples; in fact, it was more than five times faster. When biasing was used, the rate was slightly lower; this is attributed to re-sputtering and will be further addressed below.

Cyclic voltammetry (CV) measurements were performed using a PGSTAT302N potentiostat (Methrom Autolab BV) in a three-electrode cell configuration. Tests were made with both H and Li ions. The former used a 0.1 M aqueous solution of $H_2SO_4$ with a graphite counter electrode and a $WO_3$/ITO sample as the working electrode, whereas the latter used a 1 M $LiClO_4$-propylene carbonate electrolyte with a platinum counter electrode.

Tests were carried out up to 1000 cycles with an applied potential varying from −0.5 to 1.2 V vs. SCE at a rate of 25 mV/s. An initial bleaching period of 60 seconds at 1.5 V vs. SCE was applied prior to each test. The in-situ transmission variation vs. time was obtained with a MultiSPec Pro spectrophotometer (Tec5) equipped with a stabilized white light source and a homemade optical setup. Spectra were acquired in the 350 nm to 900 nm range assessed every 500 ms.

The film thickness and the optical properties were assessed using a RC2 variable angle spectroscopic ellipsometer from J.A. Woollam Co., and measurements were performed at four angles of incidence (45°, 55°, 65°, 75°) from 200 nm to 1700 nm. The properties were derived using general oscillator models to match the layers' optical response in the CompleteEase software also from J.A. Woollam Co.

Additional microstructural and chemical analyses were performed using a variety of complementary techniques. For example, surface topography images (500 nm×500 nm) were acquired using AFM in the peak force quantitative nanoscale mechanical (QNM) imaging mode using a Dimension ICON instrument from Bruker on samples before and after cyclic voltammetry; the data were then analyzed using the NanoScope Analysis software. SEM (JEOL JSM-7600F) imaging at an acceleration voltage of 10 kV of the top surface of the cross-section of the samples was performed in order to detect structural changes induced by biasing. The crystallinity of the $WO_3$ was then examined by XRD with a D8 Discover diffractometer from Bruker; note that, as will be discussed shortly, the films were found to be X-ray amorphous. Finally, the films' composition and density was obtained through RBS measurements using a 6 MV Tandem accelerator with a 2 MeV He beam and a 170° retrodiffusion angle.

In order to detect the possible presence of nanocrystallinity, selected area electron diffraction (SAED) patterns as well as high resolution TEM images were acquired with a JEM-2100F transmission electron microscope equipped with a field-emission gun using bright field mode at 200 kV. Samples deposited on silicon substrates were scratched to generate powder and then transferred onto a carbon-coated copper grid. The analyzed areas were confirmed to be $WO_3$ using energy dispersive X-ray spectroscopy (EDX).

Sample Results

Ellipsometric modelling was performed on Si substrates in order to obtain the optical properties of the $WO_3$ films and gain insight into their microstructure. All samples were modelled in the bleached state using a combination of a Tauc-Lorentz and Gaussian oscillators for the UV absorption region. Refractive indices at 550 nm were evaluated at 2.06 and 2.24 for the layers prepared without biasing at 20 mTorr and at 1 mTorr, respectively, in accordance with values typically found in the literature for sputtered $WO_3$ thin films. Modelling of the biased layer (see Table 1) involved two regions with slightly different optical properties and an average value of 2.18 for the refractive index at 550 nm. These two distinct regions represent an amorphous and a crystalline phase, identified using TEM imaging (see FIG. 16a, discussed in greater detail below). The refractive index was found to be in between the two previous values at 2.18, suggesting a reduced density compared to the non-biased 1 mTorr layer. Although this density reduction and refractive index value can be attained simply by increasing the deposition pressure, characterization shows that biasing grants additional important performance improvements as discussed below.

Cyclic voltammetry (CV) is a preferred approach for evaluating the electrochemical activity and stability of EC thin films. Because the coloration/bleaching dynamics are limited by the diffusing ions, protons are often of interest due to their smaller size and thus higher diffusion coefficient. Although this is not necessarily a critical factor in the case of smart windows, it can be of importance in multiple other applications. Part of the present CV tests are thus run in a 0.1 M sulfuric acid electrolyte where the $WO_3$ films are consequently exposed to a fairly aggressive environment throughout the duration of the test. Indeed, $WO_3$ is known to be highly vulnerable to dissolution in water and aqueous acids, a phenomenon which is exacerbated by the addition of a voltage (voltage-enhanced dissolution). Studies also suggest that a main cause of degradation of proton-based all-solid-state EC devices is chemical degradation of the $WO_3$ following chemical side reactions and gas formation. Thus, a film capable of withstanding the harsh testing conditions of the present CV tests is expected to perform better in terms of durability when implemented in an all-solid-state device. It will be appreciated that bigger and slower Li ions are often chosen in order to decrease the presence of side reactions. Although this may be beneficial from a side reactions standpoint, other side effects such as charge trapping may also ensue and impact device durability. These and/or other approaches may be used in different example embodiments of this invention.

Additional characterization parameters can be derived from the voltammograms and the in situ transmission measurements, and will be used to supplement the analysis of the electrochemical behavior. The first is the coloration efficiency (CE), which quantifies how easily a layer colors upon charge insertion, and is expressed as $CE = \ln(T_{bleached}/T_{colored})/q_{ins}$, where $T_{bleached}$ is the transmission value at 550 nm in the bleached state, $T_{colored}$ is the transmission value at 550 nm in the colored state, and $q_{ins}$ (C/cm$^2$) is the inserted charge per surface area. Other parameters of interest include the charge extraction ratio, used to quantify trapping or charge loss, and the diffusion coefficient, used to measure how easily ions travel through the layer. The latter can be calculated using the peak anodic current (maximum current during the bleaching phase). Results of both the proton and lithium insertion tests are presented in Table 2.

TABLE 2

Electrochromic parameters for proton and lithium insertion (initial-final values after 150 cycles). Average values are used instead when the variation throughout the test is judged as negligible.

| Sample | Coloration Efficiency (cm²/C) | | Diffusion Coefficient ($10^{-10}$ cm²/s) | | Charge Extraction Ratio (%) | | Transmission Variation @ 550 nm (%) | |
|---|---|---|---|---|---|---|---|---|
| | $H^+$ | $Li^+$ | $H^+$ | $Li^+$ | $H^+$ | $Li^+$ | $H^+$ | $Li^+$ |
| 1 | 65-35 | 31 | 220-60 | 1.90-1.40 | 90-85 | 99 | 53-20 | 32-26 |
| 2 | 60 | 28 | 0.1-12 | 0.03 | 45-70 | 78-99 | 3-22 | 6-4 |
| 3 | 69 | 24 | 60-120 | 0.40-1.15 | 90 | 88-99 | 50 | 20 |

Figure 2A:
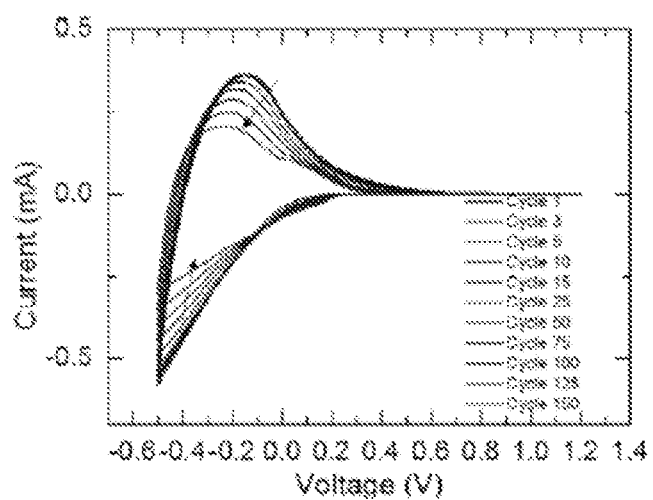
FIG. 2a plots cyclic voltammetry (CV) test results at 25 mV/s in 0.1 M $H_2SO_4$ over 150 cycles for the 20 mTorr-deposited $WO_3$ layer.
Figure 2B:
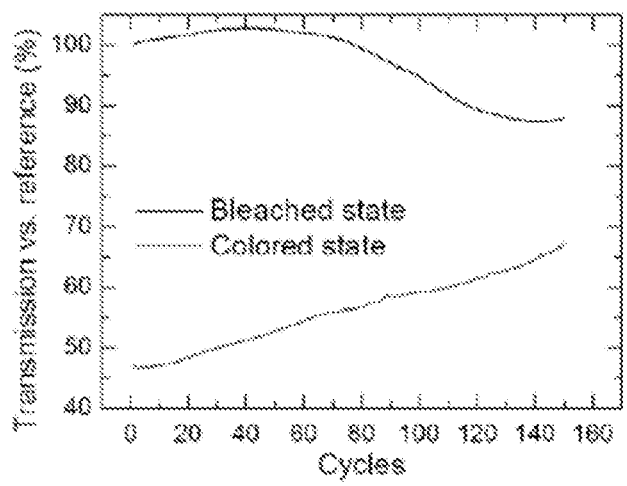
FIG. 2b plots transmission in the maximum bleached and colored states at 550 nm for the FIG. 2a samples.

The first tests concern the traditional porous film prepared at 20 mTorr (2.67 Pa) with proton insertion. The resulting cyclic voltammograms for the first 150 cycles and corresponding optical measurements are shown in FIGS. 2a-2b. That is, FIG. 2a plots CV test results at 25 mV/s in 0.1 M $H_2SO_4$ over 150 cycles for the 20 mTorr-deposited $WO_3$ layer, and FIG. 2b plots transmission in the maximum bleached and colored states at 550 nm. The arrows in FIG. 2a indicate increasing cycles. In FIG. 2b, the reference 100% was taken in the bleached state.

As expected, the sample displays a very intense initial EC activity, but shows a steady degradation over time. The variation of the bleached state transmission is attributed mostly to changes in the optical thickness through voltage-enhanced dissolution of the layer; this decrease in thickness results in a shift of the interference fringes and thus the oscillating nature of the transmission curve in FIG. 2b and the initial increase in transmission over 100%. These side reactions can also explain the 90% charge extraction ratio as charge trapping is expected to be low in such a porous film; indeed, a 99% charge extraction ratio is found when using larger Li ions (see Table 2). The colored state also exhibits a continuous increase over time, indicating a decrease in charge insertion as observed on the voltammograms due to film dissolution in the electrolyte. Overall, the film shows an initially good performance, but its quick degradation in an acid electrolyte is not surprising. This decay is also reflected in the change in coloration efficiency from 65 to 35 cm²/C, as well as the drop in diffusion coefficient from $22\times10^{-9}$ cm²/s to $6\times10^{-9}$ cm²/s, and the significant loss in $\Delta T$ from 53% to 20% (see Table 2).

Figure 3A:
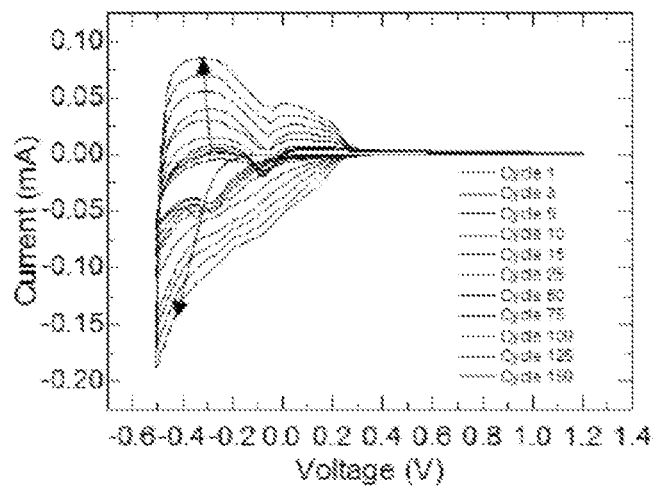
FIGS. 3a-3b show the results of the same measurements as those provided in FIGS. 2a-2b for a low pressure sample (1 mTorr) with no biasing.
Figure 3B:
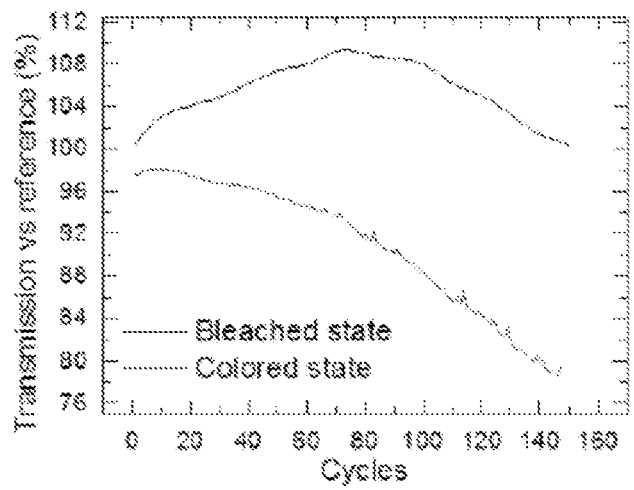

FIGS. 3a-3b show the results of the same measurements as those provided in FIGS. 2a-2b for the low pressure sample (1 mTorr) with no biasing. That is, FIG. 3a plots CV test results at 25 mV/s in 0.1 M $H_2SO_4$ over 150 cycles for the 1 mTorr-deposited $WO_3$ layer, and FIG. 3b plots transmission in the maximum bleached and colored states at 550 nm. The arrows in FIG. 3a indicate increasing cycles. Peaks are attributed to a desynchronization between the in situ transmission measurement acquisition and maximum sample coloration.

It can be seen that this sample shows poor EC performance, with a diffusion coefficient two orders of magnitude lower than in the previous case at the beginning of the test (lower than $0.01\times10^{-9}$ cm²/s and peaking at $1.20\times10^{-9}$ cm²/s). This is, however, accompanied by a considerable increase in coloration at higher cycles, which can be attributed to a creation of channels within the layer through continuous insertion/extraction of ions, resulting in a facilitated ion intercalation (activation period); the variation in transmission nevertheless remains low, with a maximum value of 20%. The bleached state transmission shows a variation similar to what was observed with the 20 mTorr sample but at a lower level as the degradation speed is decreased. The voltammograms also exhibit an unusual shape with secondary peaks appearing at −0.05 and −0.3 V, which have been attributed to sub-steps in the tungsten reduction process, from $W^{6+}$ to $W^{5+}$ and $W^{5+}$ to $W^{4+}$ respectively. This two-step ion insertion process is thought to be more visible in this unbiased sample because of the greatly reduced overall intensity of the voltammogram compared to the porous sample (the currents are ~10 times lower). At higher currents, theses peaks are seen to convolute and the voltammogram appears more continuous, as can be seen for later cycles. These peaks are also a sign of the possible presence of crystallinity in the films as will be addressed below. The performance using Li ions was even poorer and is not shown. These measurements serve to demonstrate that the unassisted low pressure $WO_3$ film is quite poor electrochemically, and also damaged through dissolution; this is also confirmed from the visual appearance of the sample, which appears diffusive to the naked eye following CV testing.

Figure 4:
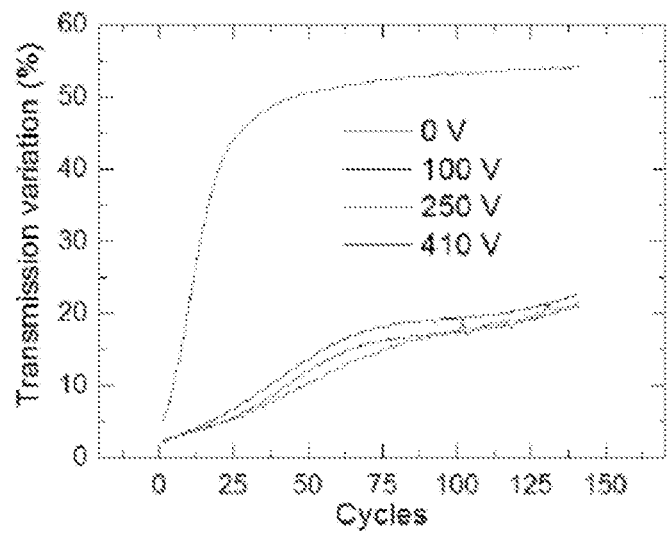
FIG. 4 shows the transmission variation (ΔT) of preliminary samples of $WO_3$ prepared with various applied substrate biases.

The biased samples' performance will now be discussed. Preliminary experiments showed that all samples deposited at low pressures with bias voltages lower than −400 V exhibit the expected poor EC performance, with color shifts of about 20% at best and worst performance with higher bias values. See FIG. 4, which shows the transmission variation ($\Delta T$) of preliminary samples of $WO_3$ prepared with various applied substrate biases. However, above a threshold potential, the electrochromic activity of the material was seen to suddenly greatly increase. It is also important to note that samples deposited at higher pressures (20 mTorr) were also negatively impacted under all bias values (not shown here).

Figure 5A:
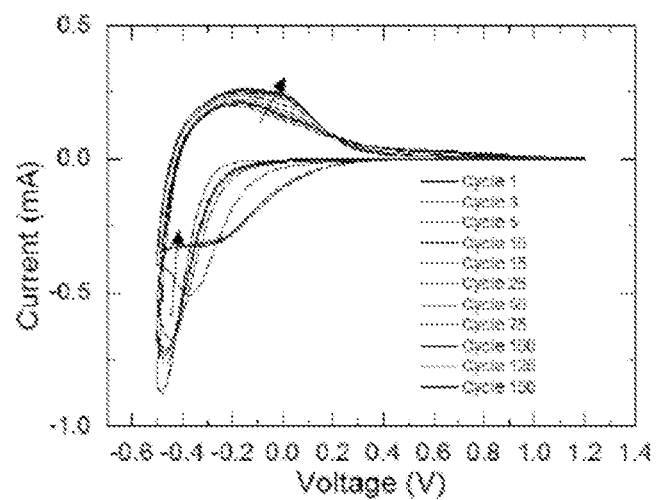
FIGS. 5a-5b show the results of the same measurements as those provided in FIGS. 2a-2b and 3a-3b for a sample with biasing.
Figure 5B:
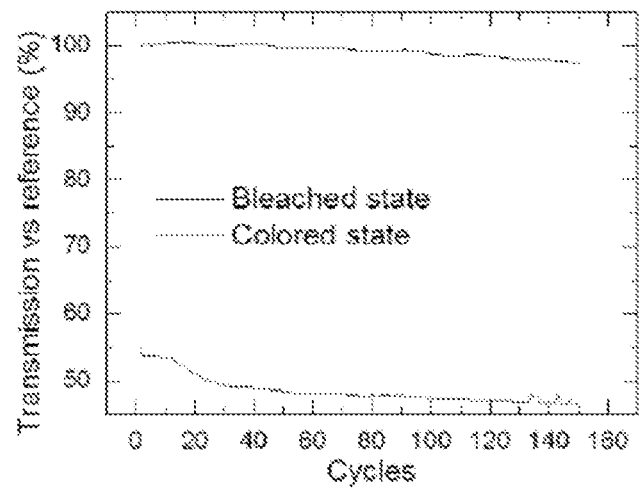

Samples therefore were prepared at −526 V of bias, which had the best impact on the performance, as can be observed in FIGS. 5a-5b. Indeed, this layer offered the best characteristics thus far with a CE of 69 cm²/C, a diffusion coefficient varying from $6\times10^{-9}$ cm²/s to $12\times10^{-9}$ cm²/s from start to finish (150 cycles), and a stable 90% charge extraction ratio, as well as a short activation period. These parameters are similar to those of the traditional porous sample in terms of coloration dynamics with the addition of a higher stability.

Figure 6A:
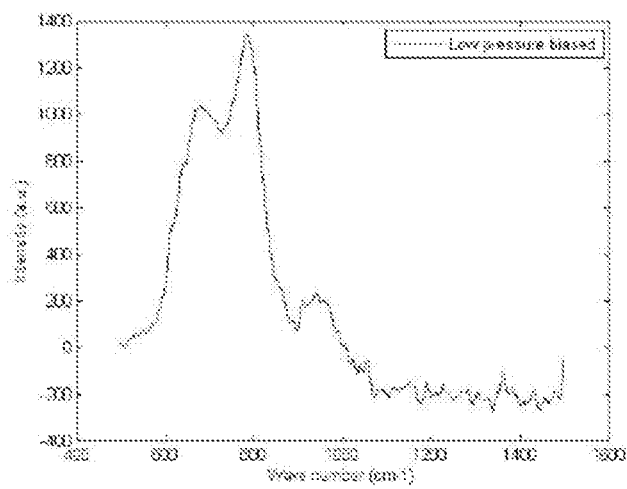
FIGS. 6a-6c Raman spectra for the biased, non-biased, and high pressure samples.
Figure 6B:
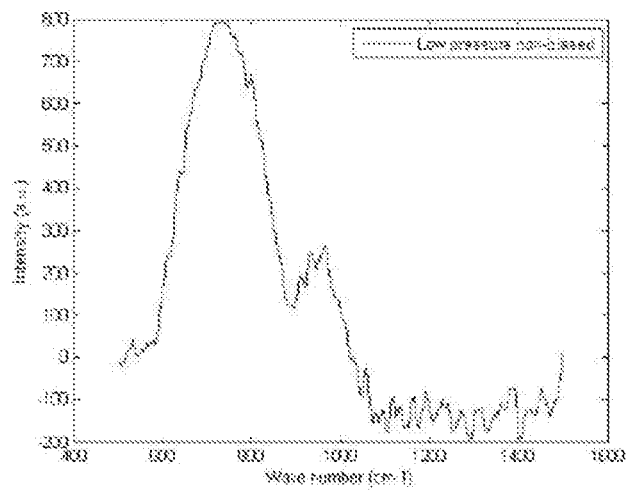
Figure 6C:
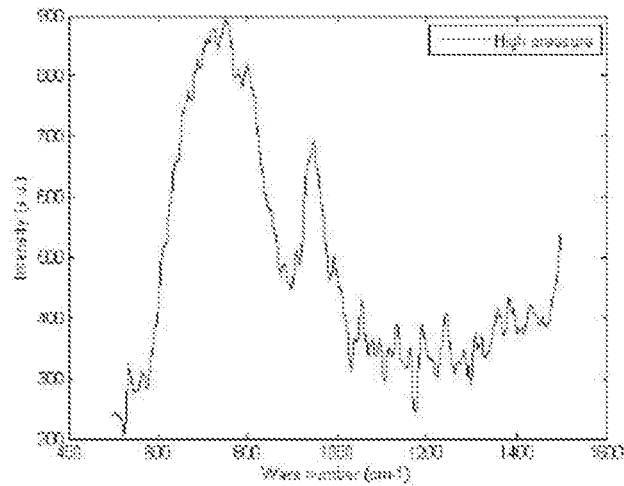

Additionally, the $\Delta T$ was stable at 50% for most of the duration of the test, after a sharp increase at the beginning attributed to the same channel creation mechanism observed in the previous dense sample. Contrary to the porous film, the chemical stability of the biased film exhibits negligible variation after 150 cycles; this can be deduced from the stable and even increased surface area of the voltammograms, as well as the stable $\Delta T$ (see FIG. 5b). The slow drop in the bleached state transmission (3% over 150 cycles) is believed to be most probably related to some amount of deep charge trapping. Indeed, no change in appearance of the layer was visible with the naked eye, suggesting a negligible amount of layer degradation. The voltammograms also shows that a peak at −0.3 V, which has been associated with the presence of $W^{4+}$, was more prominent than in the non-biased samples. This peak has also been linked to the coloration of $WO_3$ in nanocrystalline samples, and it thus suggests its possible presence in our biased samples. Raman spectroscopy measurements of the samples also pointed towards crystallinity, with two peaks around 700 and 800 cm$^{-1}$ for the biased sample, and a single broader peak for the other samples. A similar effect has been observed, where crystalline WO$_3$ exhibited two peaks at 719 and 807 cm$^{-1}$, while amorphous WO$_3$ only had a single broad peak associated with the W—O stretching bond. The broadness of the peaks in this case could indicate that the sample is partially crystalline and amorphous. Raman spectra for the biased, non-biased, and high pressure samples are shown in FIGS. 6a-6c, respectively.

In view of the foregoing, it will be appreciated that certain example embodiments have a CE holding stable (e.g., +/−10%, more preferably +/−5%) at at least 60 cm$^2$/C after 150 cycles, more preferably at at least 65 cm$^2$/C after 150 cycles, and still more preferably at at least 69 cm$^2$/C or higher after 150 cycles. The charge extraction ratio is at least 85%, more preferably at least about 90%, after 150 cycles, in certain example embodiments. In certain example embodiments, the transmission variation between colored and bleached states preferably remains at at least 40%, more preferably at least 45%, and still more preferably at least 50% or more, after 150 cycles. Of course, it will be appreciated that these (and other) parameters may be sample- and/or test-dependent and thus need not necessarily be seen as target values. For example, decreasing the CV scan rate may increase the transmission variation and likely decrease the long-term durability, the CE may decrease if too much charge is inserted, the change in transmission may be dependent on other factors including film thickness, etc. More generally, having a CE that varies by no more than 10% (more preferably no more than 5%), a transmission variation of at least 40% (more preferably at least 45%, and still more preferably at least 50%), etc., may be desirable in certain example embodiments. In this more general case, such values may be applicable over the useful lifetime of the product, for example.

The performance enhancement following biasing may seem counterintuitive. Indeed, biasing is known to normally increase the density of layers by providing additional kinetic energy to the sputtered atoms. However, it is believed that for higher bias values the energy increase can have adverse effects on the morphology. Specifically, above a certain threshold voltage, which depends on the mass ratio of the gases and material being sputtered, the layer growth enters a regime where re-sputtering of the layer is non-negligible, and other phenomena such as argon trapping, preferential sputtering of oxygen, and defects creation (missing or misplaced atoms) can occur. It is thus believed that, here, such structural changes are beneficial for the EC performance of WO$_3$ films by increasing their porosity and thus allowing for the facile insertion of ions into the layer. The increased stability could then be linked to the crystalline nature of a part of the constituent film's matrix. These considerations are further addressed below.

Figure 7A:
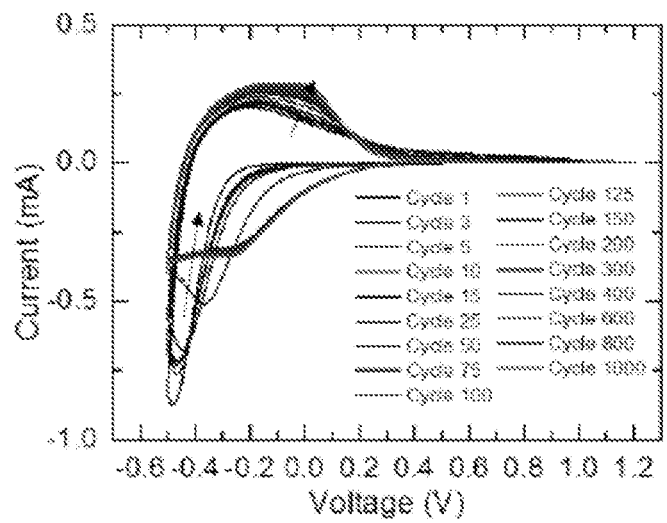
FIGS. 7a-7b show the results of the same measurements as those provided in FIGS. 2a-2b, 3a-3b, and 5a-5b for a low pressure biased sample with 1,000 cycles for a total duration of 40 hours.
Figure 7B:
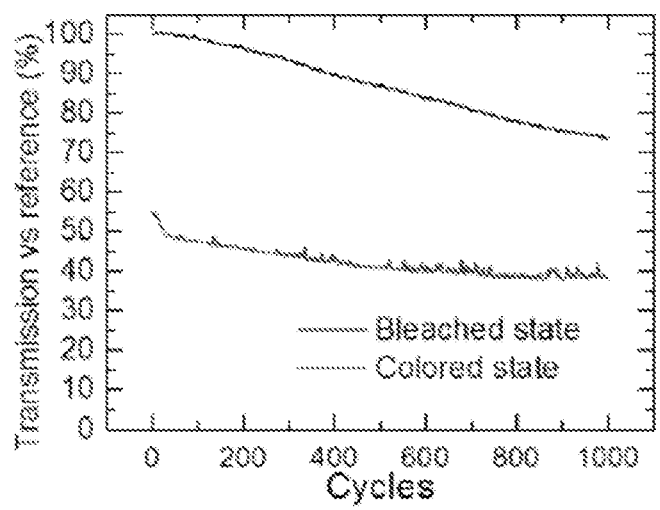

An extended CV test was performed under the same conditions as the previous ones, for 1000 cycles with a total duration of 40 hours, in order to better evaluate the long-term durability of the high bias sample. The obtained CV curves and transmission variation are shown in FIGS. 7a-7b. The CV curves are seen to stabilize after the first 300 cycles while still continuing to slightly increase in current both during insertion and extraction. There is also an important bleached state transmission reduction over the course of the test (ΔT=25%), which is attributed mostly to ion trapping (90% charge extraction ratio). This results in a ΔT variation from 50% initially to ~35% at the end of the test. Although this is a significant reduction, it is still much better than what was observed after only 150 cycles for the 20 mTorr sample (53% to 20% after 150 cycles). It therefore can be concluded that the 1 mTorr biased-sample shows an excellent EC performance and an exceptional chemical durability when compared to the 20 mTorr WO$_3$ layer described above, offering great potential for long-term proton insertion applications. In addition, it is believed that further optimization of the pressure and bias voltage can further enhance the performance, and preliminary results indicate that this is indeed the case.

Figure 8A:
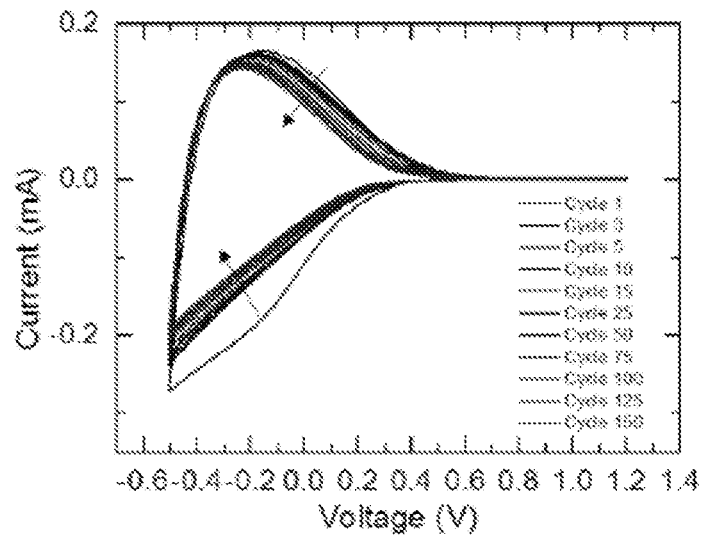
FIGS. 8a-8b correspond to FIGS. 2a-2b, except that lithium-based insertion is used instead of proton-based insertion.
Figure 8B:
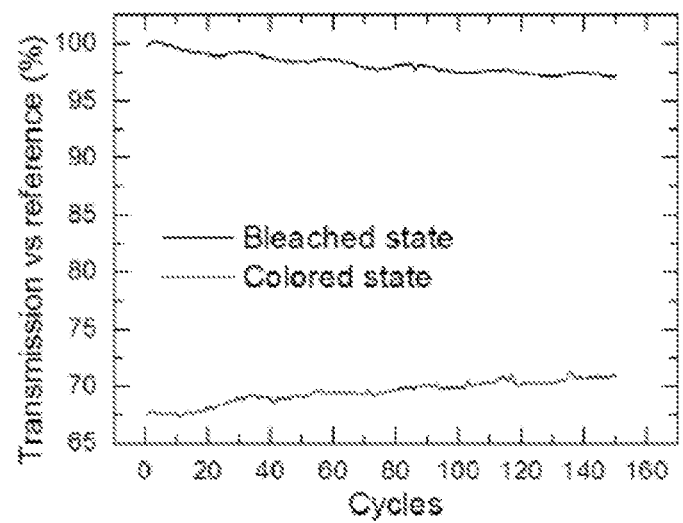

Lithium insertion is one currently favored approach to coloring WO$_3$ layers because of its increased chemical stability. All samples were therefore also tested with a lithium-based electrolyte. FIGS. 8a-8b present the results for the 20 mTorr layer. The resulting performance is very similar to the one observed when using proton insertion (see FIGS. 2a-2b), albeit with a lower CE value of 31 cm$^2$/C and a reduced diffusion coefficient at around 1.5×10$^{-10}$ cm$^2$/s. These values are not surprising considering the slower dynamics of the bigger Li ions. However, an interesting point is the greatly reduced degradation of the layer, even though a loss of about 6% of ΔT, from 32% to 26%, is still present. This drop in T$_{bleached}$ and slow increase of T$_{colored}$ can once again be associated with charge trapping although, with a value of 99% in charge extraction ratio, very little ion trapping and side reactions take place for each individual cycle.

Figure 9A:
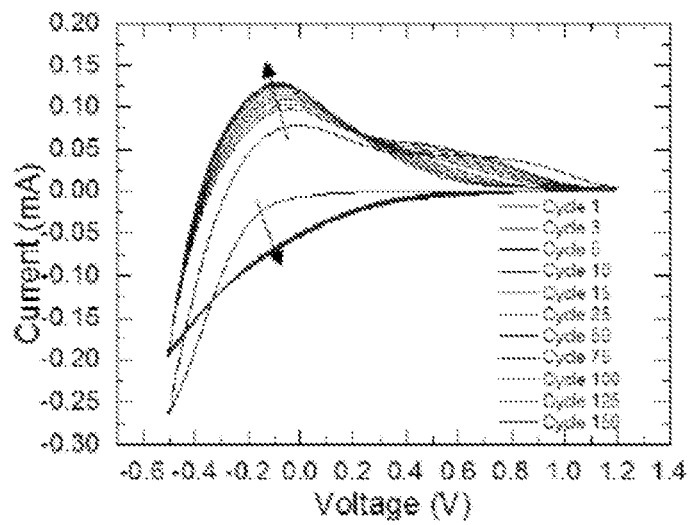
FIGS. 9a-9b correspond to FIGS. 5a-5b, except that lithium-based insertion is used instead of proton-based insertion.
Figure 9B:
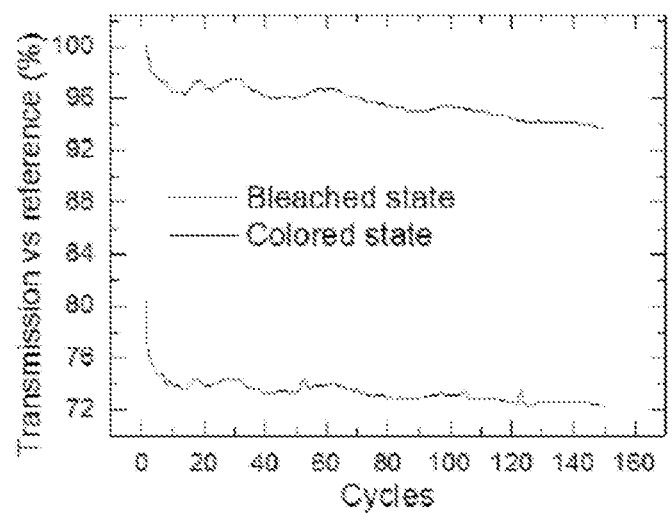

In the case of the bias-deposited film, upon lithium insertion, a clear drop in the transmission of 4% is observed after only 5 cycles, indicating the presence of deep trapping (see FIGS. 9a-9b). This is also accompanied by a charge extraction ratio of approximately 88%. Subsequently, the layer stabilizes, and it maintains a consistent 20% ΔT over the whole duration of the test, and a CE of 24 cm$^2$/C, although both the bleached state and colored state transmission values continue to decrease slightly. After 150 cycles, the extraction ratio has, on the other hand, reached a value of 99%, which is similar to that of the porous film. The diffusion coefficient is also about three times lower than in the porous sample: 0.4×10$^{-10}$ cm$^2$/s at the start of the test, followed by an increase to 1.2×10$^{-10}$ cm$^2$/s over time. The results described above indicate that the layer is slightly over-dense to properly allow for the diffusion of bigger Li ions, although some amount of channel creation occurs during the first few cycles. The end result is that the layer does not perform as well in these conditions, essentially because of ion trapping. Once again, it will be appreciated that the deposition conditions have not been completely optimized for Li ions yet, and there likely exist more favorable deposition conditions leading to a more appropriate microstructure. Fine tuning of the deposition conditions may be performed to yield better results in some instances. In addition, a recently developed rejuvenation process could be of interest in the present context to "de-trap" the Li ions and thus obtain an activated film with a higher diffusion coefficient and almost pristine electrochromic properties.

In view of the foregoing, it will be appreciated that certain example embodiments have a CE holding stable (e.g., +/−10%, more preferably +/−5%) at at least 20 cm$^2$/C after 150 cycles. The charge extraction ratio is at least 85%, more preferably at least about 90%, and still more preferably 95-99% after 150 cycles, in certain example embodiments. In certain example embodiments, the transmission variation between colored and bleached states preferably remains at at least 15%, more preferably at least 20%, after 150 cycles. It also will be appreciated that there is a significant, e.g., more than double and sometimes almost triple, increase in diffusion coefficient, after 150 cycles. As above, it will be appreciated that these (and other) parameters may be sample- and/or test-dependent and thus need not necessarily be seen as target values. More generally, having a CE that varies by no more than 10% (more preferably no more than 5%), a transmission variation of at least 15% (more preferably at least 20%, and still more preferably at least 25%), etc., may be desirable in certain example embodiments. In this more general case, such values may be applicable over the useful lifetime of the product, for example.

Following the CV tests, structural and morphological characterizations of the samples were performed to better understand the effect of biasing and its ability to enhance the EC performance of samples sputtered at low pressures. The microstructure plays an essential role in the charge injection process, which colors $WO_3$, and it is along the network of voids in the material where ionic transport occurs. Therefore, an increase in the amount of interconnected voids in the film should result in an increased EC performance.

Figures 10A, 10B, 10C:
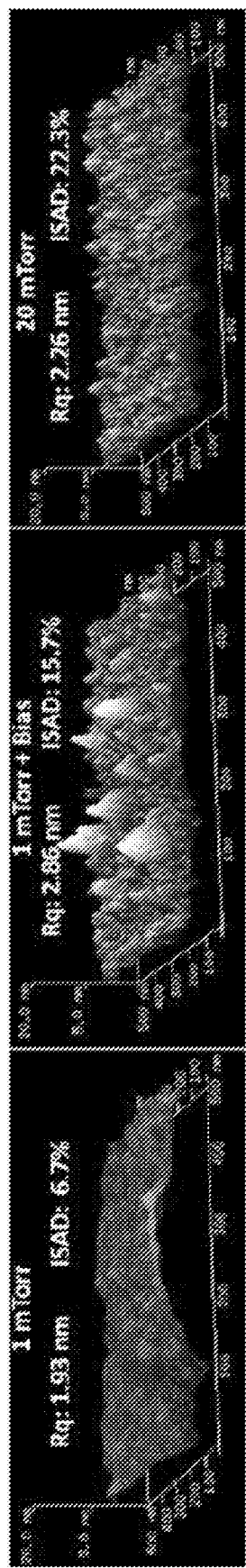
FIGS. 10a-10c are AFM images reflecting measurements of a 500 nm×500 nm surface on as-deposited samples before CV, with a film deposited at low pressure being shown in FIG. 10a, a low pressure bias-deposited film being shown in FIG. 10b, and a "traditional" high pressure film being shown in FIG. 10c.

The surface of the samples was first analyzed by AFM. This permitted observation of both the impact of biasing, as well as of CV degradation on the morphology of the layers. FIGS. 10a-10c show the surfaces before the CV tests. More particularly, FIGS. 10a-10c are AFM images reflecting measurements of a 500 nm×500 nm surface on as-deposited samples before CV, with a film deposited at low pressure being shown in FIG. 10a, a low pressure bias-deposited film being shown in FIG. 10b, and a "traditional" high pressure film being shown in FIG. 10c. The RMS roughness (Rq) and integrated surface area difference (ISAD) are also shown on the images.

It is clear from FIGS. 10a-10c that biasing results in an increased surface roughness in comparison to the 1 mTorr non-biased layer and a less homogeneous surface with larger localized peaks. The Rq roughness value is slightly higher than the 20 mTorr film as well (2.86 nm vs. 2.26 nm). The ISAD represents the area difference between the surface and its projection and is significant here because it reflects the available surface area for ion insertion, which is a critical parameter for the electrochromic dynamics at the electrolyte/surface of the film interface.

It can be seen that although the bias-assisted process results in more intense peaks, the high pressure sample nevertheless displays a higher uniformity and a larger surface area. In addition, the re-sputtering porous microstructure-inducing process is in fact present during the whole growth process so that it may be assumed that defects such as pores and interconnected channels are also present in the bulk of the film.

Figures 11A, 11B:
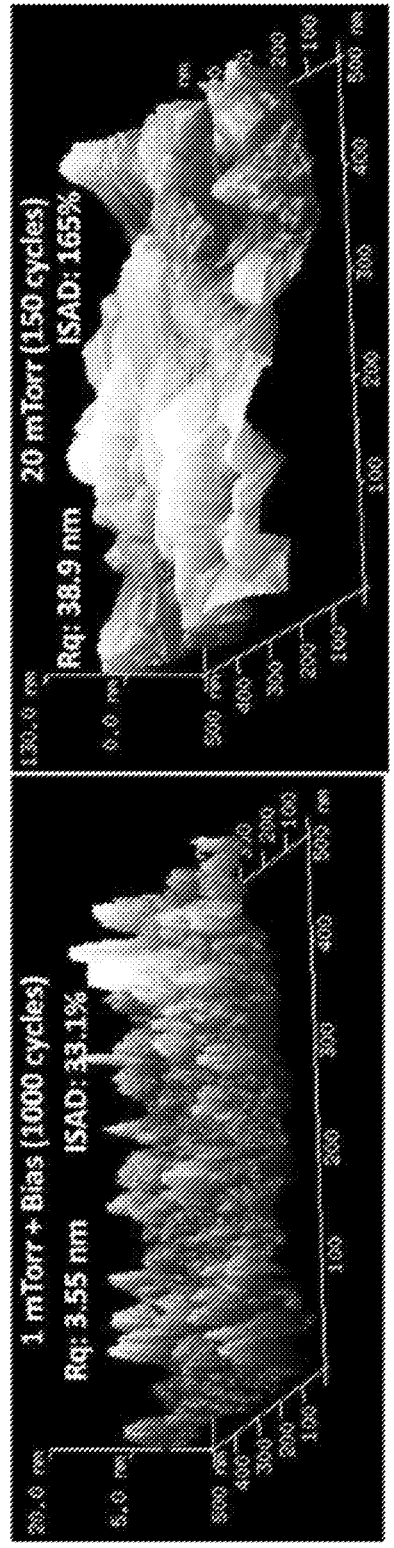
FIGS. 11a-11b are images showing AFM surface topography measurements after CV cycling with $H_2SO_4$ as the electrolyte.

In order to confirm the film's durability towards chemical degradation, measurements were also performed on the layers after cycling for the bias-deposited and 20 mTorr layers (see FIGS. 11a-11b). The biased layer shows higher values of Rq and ISAD after the 1000 cycles of CV testing, indicating that it has been somewhat degraded. However, the damage remains limited as the morphology is quite similar. In contrast, the 20 mTorr layer shows a very intense degradation after only 150 cycles, with complete parts of the film having seemingly been removed. In fact, not only is the roughness higher, the maximum variations are much larger with the highest peaks having a height of 130 nm, which is a value very nearly equal to the thickness of the layer and thus confirms that the layer has been completely removed in some areas. These measurements clearly indicate increased durability of the biased sample compared to the 20 mTorr layer that exhibits the devastating effect of an aggressive $H_2SO_4$ environment.

It will be appreciated that certain example embodiments may include as-deposited films with a roughness (Rq) of 2.3 nm or greater, more preferably 2.50 nm or greater, and still more preferably 2.75 nm of greater (e.g., up to about 3.5 nm). In certain example embodiments, ISAD may increase from an as-deposited level of about 15% to approximately double this value after 1000 cycles, e.g., with ISAD reaching no more than 50% after prolonged usage, demonstrating its high durability. Once again, it will be appreciated that these (and other) parameters may be sample- and/or test-dependent and thus need not necessarily be seen as target values.

Figures 12A, 12B:
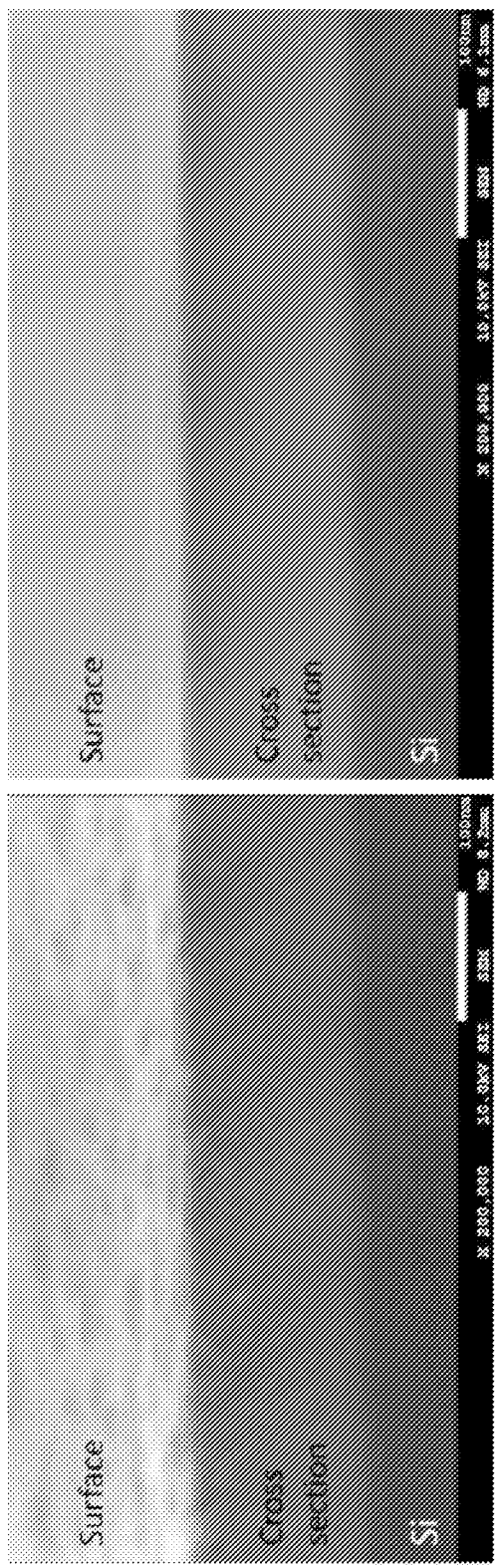
FIGS. 12a-12b are SEM images of $WO_3$ samples prepared at 1 mTorr, created using biasing and without biasing, respectively.

The bulk of the layer also was investigated. In this regard, SEM images of biased and non-biased samples of $WO_3$ layers prepared at 1 mTorr on Si substrates were taken in order to help examine the effect of biasing on the microstructure of the films. See FIGS. 12a-12b in this regard. These images were taken at a slight angle in order to observe both the cross-section and the surface of the samples at the same time.

It can be seen from these images that the biasing clearly affects the microstructure of the layer. The 1 mTorr sample is smooth and featureless, while the porous sample has a columnar-like structure with a very rugged surface. The result of the films of certain example embodiments seems to include a porous structure, causing the impressive gain in EC performance through higher surface area and easier ion access.

In order to better evaluate the porosity, density, and chemical composition of our $WO_3$ films, RBS measurements were also made on all of the samples. The obtained values are presented in Table 3.

TABLE 3

Atomic composition of the $WO_3$ samples determined by RBS measurements

| Sample | W (%) | O (%) | O/W ratio | Ar (%) |
|---|---|---|---|---|
| 20 mTorr | 22.2 | 77.7 | 3.5 | 0.0 |
| 1 mTorr (unbiased) | 25.0 | 73.0 | 2.9 | 1.8 |
| 1 mTorr (biased) | 23.8 | 73.2 | 3.1 | 2.8 |

The presence of argon in the low pressure samples, and in higher concentration for the biased one, is also noted. This indicates that there is some argon trapping occurring during deposition and that it is accentuated by biasing. The analysis also reveals that the 1 mTorr layers are very close to the $WO_3$ stoichiometry with a O/W ratio of 2.9 for the unbiased and 3.1 for the biased sample, with the biased sample being slightly over-stoichiometric, while the 20 mTorr layer shows a 3.5 O/W ratio. Both of those higher-than-3 ratios could however be explained by the presence of chemically absorbed water in the layer, even more so in the case of the very porous 20 mTorr sample. This would indicate that the biased sample in its as-prepared state absorbs more water than the unbiased one, but less than the high pressure layer, once again in agreement with the density measurements. Certain example embodiments have a O/W ratio of 2.7-3.3, more preferably 2.7 or 2.9 to 3.1, and possibly from 2.9-3.0, e.g., with an example O/W ratio being at or just under 3.0. Certain example embodiments also preferably include less than 3.5 at. % Ar, more preferably less than 3.0 at. % Ar, and still more preferably less than 2.8 at. % Ar. In some instances, it may be possible to achieve less than 2.0 at. % Ar. Certain example embodiments may include 2.0-3.0 at. %

Ar in the film. Although Ar is described, it will be appreciated that other processing gases (e.g., other inert gases such as Kr, Xe, etc.) may be used in different example embodiments, and that the coating may contain atoms and/or the like from the processing gas.

Knowing the surface atomic density of the layers and their thickness through ellipsometry allows one to calculate the density and packing density of the samples (e.g., using a bulk density of 7.16 g/cm$^3$). Through the use of an effective medium approximation, specifically the Lorentz-Lorenz model, it also possible to calculate the packing density of the layers using the refractive index to compare with the RBS (Rutherford Backscattering Spectroscopy) results. These values can be found in Table 4.

TABLE 4

Density and porosity of WO$_3$ samples through RBS and ellipsometry measurements

| Sample | Thickness (nm) | Density (g/cm$^3$) | Packing density by RBS (%) | n @ 550 nm | Packing density (Lorentz-Lorenz) (%) |
|---|---|---|---|---|---|
| 20 mTorr | 136 | 5.2 | 72.6 | 2.06 | 81.6 |
| 1 mTorr (unbiased) | 133 | 6.5 | 90.8 | 2.24 | 90.0 |
| 1 mTorr (biased) | 137 | 6.1 | 85.2 | 2.17 | 86.9 |

It will be appreciated that the low pressure sample is denser than the high pressure one. These results confirm that the biased layer is at an intermediate state between the porous 20 mTorr and the dense 1 mTorr layer. Also, while considering the packing densities obtained by RBS and using the Lorentz-Lorenz EMA (Effective-Medium Approximation) match the two 1 mTorr samples, the 20 mTorr sample showed a higher value in packing density obtained from the EMA calculation. This difference can be explained by the limitations of the model, which assumes homogeneously dispersed nano-sized inclusions throughout the layer. This discrepancy between the results could thus be attributed to the inhomogeneous nature of the film. It thus will be appreciated that certain example embodiments have a pseudo-porous nanostructure, e.g., with a packing density less than 90%, more preferably less than 85%, sometimes in the 80-85% range, and still more preferably even lower (e.g., in the 70-80% range).

Finally, although all films were observed to be XRD amorphous, TEM measurements of the samples were performed to confirm the possible presence of bias-induced nanocrystallinity. The imaging was made on WO$_3$ particles that were scratched-off the Si samples using a diamond tip, as well as on films deposited on ITO-covered substrates. The analyzed sections of the collected material were confirmed to be pure WO$_3$ through EDS (Energy Dispersive Spectroscopy) measurements. The analysis of the unbiased sample confirms that it was indeed uniformly amorphous. Correspondingly, the SAED (Selected Area Electron Diffraction) image shows diffuse concentric rings, characteristic of an amorphous material. FIG. 13a is a TEM image of the scratched-off 1 mTorr WO$_3$ film, and FIG. 13b is the corresponding SAED image. The same conclusions were obtained for the films deposited on ITO (see FIG. 14a for the TEM image of the 1 mTorr WO$_3$ film on ITO and FIG. 14b for the corresponding SAED image).

Figures 15A, 15B:
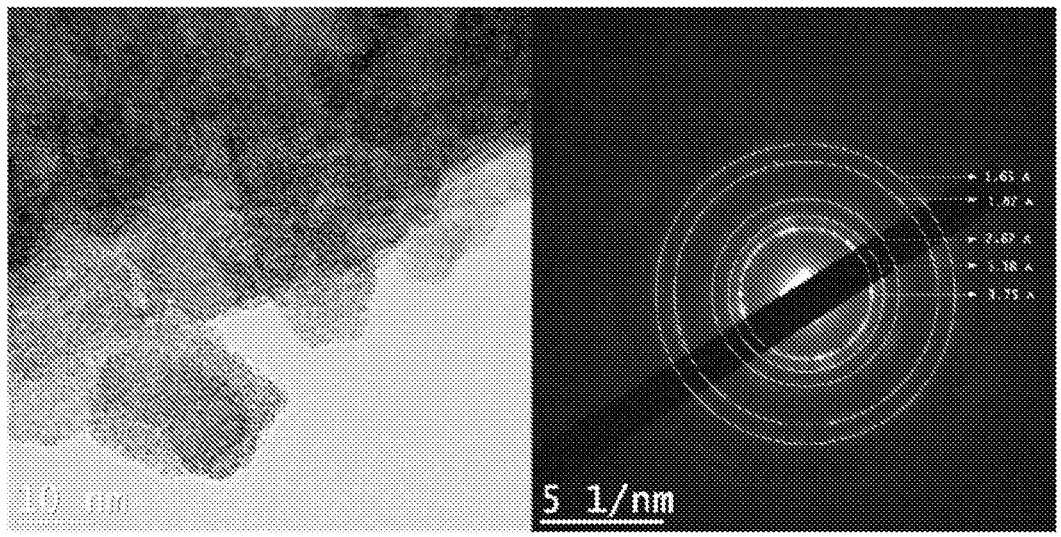
FIG. 15a is a TEM image of the 1 mTorr biased $WO_3$ film on a Si substrate.
FIG. 15b is the corresponding SAED image.
Figures 16A, 16B:
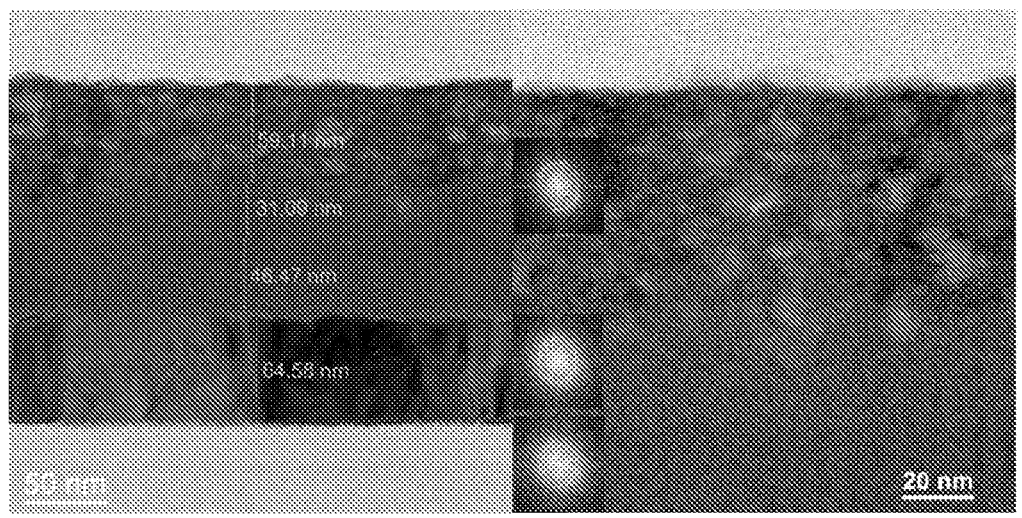
FIG. 16a is a TEM image of the 1 mTorr biased $WO_3$ film on ITO, showing amorphous and crystalline regions.
FIG. 16b shows the corresponding SAED images.

Measurements performed on the biased sample revealed interesting results. For example, although parts of the collected particles were amorphous, a presence of nanocrystallinity was observed. This can be clearly seen in FIG. 15a, where crystalline planes around 10 nm in length are present, but may be too few in numbers to be detected by the XRD method. This results in clearly defined concentric rings on the SAED image of FIG. 15b, confirming the polycrystalline nature of the analyzed material. Additionally, the interplanar spacing obtained from the SAED data (shown in FIG. 15b), yields a value closely matching a monoclinic crystal system with a lattice parameter of 3.75 Å [JCPDS no. 431025]. It is clear from these two measurements that the use of significant substrate biasing promotes nanocrystallinity in WO$_3$ films. Interestingly, FIG. 16a shows that the growth of the biased films goes through various stages, with crystallization starting only after approximately half of the deposition time, most probably because of the material reaching a localized critical temperature resulting from the high ion bombardment. FIG. 16b displays the SAED image, indicating that the underlying film is amorphous and that the top layer is polycrystalline. The partly crystalline nature of this material can explain why the resulting layers are much more durable than amorphous films.

The morphology of the layer also has a significant impact on the performance; larger internal volume aids in proper ion intercalation. Studies have shown that annealing gives control over the size of the nanocrystals, in order to optimize for the best EC performance. These same studies have found optimal temperatures around 200° C., past which the crystal sizes grew too large to allow for adequate EC properties. This suggests that a similar crystallite size control could be obtained using the present process by modifying the deposition parameters in order to reach the optimum crystal size and morphology, and maybe attaining an earlier onset of crystallization.

The presence of nanocrystallinity is not only important from the durability standpoint, but also from the energy perspective as polycrystalline WO$_3$ films have been shown to display a more Drude-like behavior and thus reflection-based modulation as a function of intercalation. The transfer from absorption to reflection-based modulation is of importance for architectural applications, as this can limit the amount of absorbed solar energy and consequently black body infrared re-emission.

It will be appreciated from the above that certain example embodiments of this invention include forming electrochromic tungsten oxide (e.g., WO$_3$ or other suitable stoichiometry) films, using high substrate biasing in order to enhance its EC activity. When compared to previous best performing layers deposited at higher pressures, those prepared at low pressure and high bias voltage (e.g., over −400 V, and more preferably over −500 V) demonstrate vastly increased durability, similar EC activity and five times higher deposition rates. The ability of substrate biasing above a critical threshold to enhance the tungsten oxide film's EC performance is believed to be attributable the creation of a pseudo-porous nanostructure (void network) and the presence of nanocrystallinity. This is supported by SEM imaging of samples that shows a change in microstructure, RBS and ellipsometric measurements that show an increase in porosity, and AFM surface analysis that detects higher peak roughness after biasing, as well as TEM imaging that shows the clear presence of polycrystallinity at the nanoscale in biased samples. Cyclic ion insertion is thought to open up channels to pores present throughout the layer (activation period), allowing for easier subsequent insertion and thus increasing the performance over time. Although the biased layers did not perform as well under lithium ion insertion, this is thought to be related to the larger Li ions having more difficulty diffusing through the layer and nonetheless may be useful in certain example embodiments.

The performance and/or durability of samples may be improved in certain example embodiments, e.g., by heating during and/or after deposition, fine-tuning the pressure and/or applied substrate bias, etc., as the tungsten oxide film's EC properties are linked to its morphology. Annealing at 150-350° C., more preferably 175-250° C., and around 200° C. for example, may be useful in this regard. $WO_3$ is highly coveted for EC devices, and certain example embodiments have the benefit of not necessitating any chemical preparation steps or post-deposition annealing to obtain a desirable level of nanocrystallinity, while also allowing for much faster deposition rates than in the context of the deposition of traditional porous a-$WO_3$ by magnetron sputtering. Thus, it should be clear that higher temperature treatment, including annealing, may be used in certain example embodiments and may not be used in different example embodiments. Avoiding higher temperature treatment, including annealing, may be useful in certain applications, e.g., where plastic, plastic glass, or other substrates are involved (e.g., which often is the case of ophthalmic applications and/or the like).

Figure 17:
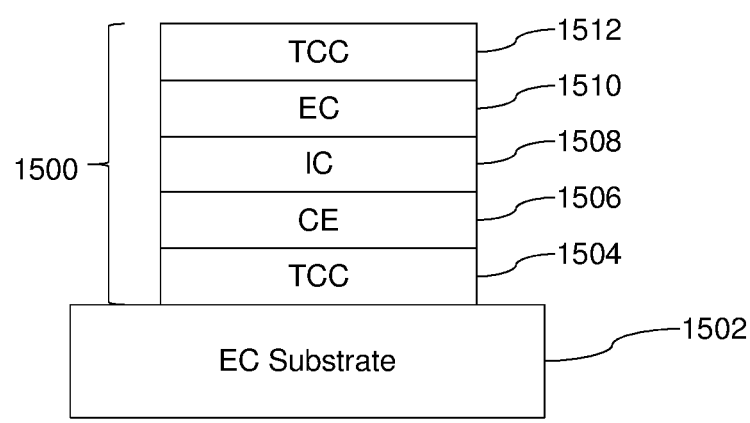
FIG. 17 is a cross-sectional view of an illustrative electrochromic substrate and stack in accordance with an example embodiment.

FIG. 17 is a cross-sectional view of an illustrative electrochromic substrate and stack in accordance with an example embodiment. FIG. 17 incorporates an electrochromic stack 1500 that is somewhat similar to known electrochromic stacks in that it incorporates conductive layers (TCCs), an electrochromic (EC) layer, a counter electrode (CE) layer, and an ion conductor (IC) layer. As will be appreciated from the above, the IC layer facilitates hydrogen ion migration in connection with EC state transitions (changes from "on" to "off" and vice versa). However, the FIG. 17 electrochromic stack 1500 differs from current stacks in terms of how the EC film 1510 is formed, which creates different performance characteristics for the overall stack 1500. For example, as should be appreciated from the above, the morphology of the layer is at least partially (and sometimes substantially) nanocrystalline, and at least pseudo-porous, which enables the overall device to be high-performing and durable over long periods of time. In addition, the EC film 1510 is formable very quickly.

As shown in FIG. 17, the EC device stack 1500 includes a first transparent conductive coating (TCC) 1504, a counter electrode layer 1506, an ion conductor layer 1508, an electrochromic film 1510, and a second TCC 1512. Each of the first and second TCCs 1504 and 1512 may be about 100-300 nm thick, more preferably about 100-200 nm thick, and for example about 200 nm thick in certain example embodiments. An example layer system for one or both of the TCCs may be based on or include ITO, Ag, NiCr, and/or the like. For instance, a layer stack comprising a layer comprising Ag may be sandwiched between layers comprising Ni and/or Cr and layers comprising ITO (with the layers comprising ITO being the outermost layers in the stacks). The anodic CE layer 1506 may be about 100-400 nm thick, and it may include NiO and contain Li or H ions. A $H_2SO_4$, $LiClO_4$-propylene carbonate, LiPON, or other based IC/electrolyte layer 1508 may be about 1-3 microns thick. Similar to the CE layer 1506, the EC film 1510 may be 100-400 nm thick. Either or both of the CE layer 1506 and the EC film 1510 may be doped, e.g., to provide for better and/or deeper coloration. Optionally, a barrier layer (not shown in the FIG. 17 example) may be provided over the outermost TCC 1512, and such a barrier layer may enable color shift. In certain example embodiments, the outermost TCC 1512 itself may enable color shift. The EC device stack 1500 is provided on an EC substrate 1502 which may, in certain example embodiments, be a glass substrate. It will be appreciated that the biasing approach described herein may be applied to a layer comprising NiO (or other EC or CE layer) in certain example embodiments. That is, NiO and/or other materials may be used for the EC and/or CE layer(s) in certain example embodiments.

The substrate 1504 may be a part of a window or other electrochromic device in different example embodiments. In certain example embodiments, glass, plastic, plastic glass, and/or other substrate materials may be used.

Although certain example electrolyte and ion materials have been noted, it will be appreciated that other example electrolyte and ion materials may be used in different example embodiments.

Although strong negative substrate biases have been discussed in connection with certain example embodiments, positive substrate biases also may be used (e.g., with negative ion bombardment). In both cases, such biases may range from the absolute value of 400 V or 500 V, to 1000 V, or a level that is still practical to implement in connection with the substrate of interest. In this regard, the inventors have discovered that there is criticality in connection with at least the voltages that are applied. The inventors determined that $WO_3$ deposition at a pressure of 5 mTorr with a voltage of −310 V would not work, and that further reductions in pressure at this voltage also would not work. Thus, the critical bias voltage is believed to be about 320-400 V, and likely in the 350-400 V or 375-400 V range. As alluded to above, there is a practical upper bound on the voltage bias, above which deposition of $WO_3$ or the like will not work. This upper bound likely is 1000 V. It will be appreciated that those skilled in the art may select voltage and pressure values appropriate for the salient operating conditions, and voltage and pressure values may depend at least in part on the sputtering chamber size, distance between the target and substrate, etc.

It will be appreciated that the EC devices described herein may be used in connection with a variety of applications including, for example, commercial and residential windows, automotive and other vehicle applications (e.g., for windows, sunroofs, rear view and side mirrors, etc.), interior privacy windows or other dividers, specialized optical interference filters (e.g., active electrochromic interference filters), security devices, sensors, energy storage devices such as batteries, metal oxide transistors for flexible electronics, ophthalmic lenses for eyeglasses, head-mounted devices, and/or the like. Window applications may be monolithic, insulating glass (IG) units (e.g., where two or more substrates are held in substantially parallel spaced apart relation to one another using an edge spacer system, and for instance where the EC device substrate is one of the major substrates of the IG unit), in vacuum insulating glass (VIG) units, etc. The example manufacturing techniques, materials, etc., described in U.S. Pat. Nos. 9,140,950; 8,858,748; 8,638,487; and 8,289,610 may also be used herein. Non-limiting examples of ophthalmic lenses include corrective and non-corrective lenses, including single vision or multi-vision lenses, which may be either segmented or non-segmented, as well as other elements used to correct, protect, or enhance vision, including without limitation magnifying lenses and protective lenses or visors. Non-limiting examples of head-mounted devices include immersive and non-immersive devices, in particular see-through devices and see-around devices. Head-mounted devices may be either augmented reality devices or virtual reality devices.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

While the invention has been described in connection with what is presently considered to be the most practical and preferred embodiment, it is to be understood that the invention is not to be limited to the disclosed embodiment and/or deposition techniques, but on the contrary, is intended to cover various modifications and equivalent arrangements included within the spirit and scope of the appended claims.

For example, based on the above teachings, those skilled in the art will be able to adjust deposition conditions of ion-assisted evaporation processes, ion beam deposition processes, and/or the like accordingly, e.g., in order to achieve the desired density and microstructure, and thus the desired film properties. Different ion sources are available on the market that can achieve high ion energies including, for example, CC102 by Denton up to 600 eV, with appropriate beam currents. Also, different RF type ion sources can be used in different example embodiments.

What is claimed is:

1. A method of making an electrochromic (EC) device, the method comprising:
    applying a negative electrical bias, which in magnitude is greater than 500 V to a substrate; and
    during application of the negative electrical bias to the substrate, sputter depositing along with an energetic ion bombardment from an ion beam on the substrate an EC film comprising tungsten oxide, the sputter deposition being performed in an environment at a pressure less than 2 mTorr, the application of the negative electrical bias being performed to promote the energetic ion bombardment during the sputter deposition, in making the EC device, wherein
    the energetic ion bombardment comprises ions with an energy of at least 400 eV, and
    the as-deposited EC film comprising tungsten oxide is at least partially nanocrystalline.

2. The method of claim 1, further comprising forming a plurality of EC device layers on the substrate, the EC device layers comprising at least counter electrode and ion conductor (IC) layers, wherein the EC film is formed to be part of the EC device layers.

3. The method of claim 2, wherein the IC layer comprises an electrolyte that facilitates hydrogen ion migration in connection with EC state transitions.

4. The method of claim 3, wherein coloration efficiency CE of the EC film is at least 60 cm²/C+/−5% after 150 cycles, being measured by cyclic voltammetry at 25 mV/s in a 0.1 M sulfuric acid electrolyte after 150 cycles, the coloration efficiency CE being expressed as $CE=\ln(T_{bleached}/T_{colored})/q_{ins}$, where $T_{bleached}$ is a transmission value at 550 nm in a bleached state, $T_{colored}$ is a transmission value at 550 nm in a colored state, and $q_{ins}$ (C/cm²) is an inserted charge per surface area.

5. The method of claim 3, wherein transmission variation between colored and bleached states remains greater than or equal to 45% after 150 cycles, being measured by cyclic voltammetry at 25 mV/s in a 0.1 M sulfuric acid electrolyte.

6. The method of claim 2, wherein the IC layer comprises an electrolyte that facilitates lithium ion migration in connection with EC state transitions.

7. The method of claim 1, wherein the EC film comprises an oxygen-to-tungsten ratio of 2.7-3.3.

8. The method of claim 1, wherein the EC film comprises an oxygen-to-tungsten ratio of 2.9-3.1.

9. The method of claim 1, wherein the EC film comprises material from an inert gas used during the sputter deposition.

10. The method of claim 9, wherein the EC film comprises 2-3 atomic percent argon.

11. The method of claim 1, wherein the as-deposited EC film has an RMS roughness (Rq) of 2.50 nm or greater.

12. The method of claim 1, wherein the negative electrical bias that is applied is greater than 500 V and lower than or equal to 1000 V in magnitude.

13. The method of claim 1, wherein the pressure is about 1 mTorr.

14. The method of claim 1, wherein the EC film has a pseudo-porous nanostructure with a packing density less than about 85%.

15. A method of making an electrochromic (EC) device, the method comprising:
    forming a first transparent conductive coating (TCC), directly or indirectly, on a glass substrate;
    forming a plurality of EC device layers directly or indirectly on the first TCC, the EC device layers including a counter electrode layer, an ion conductor (IC) layer directly or indirectly on the counter electrode layer, and an EC film directly or indirectly on the IC layer; and
    forming a second TCC, directly or indirectly, on an uppermost layer of the EC device layers;
    wherein the EC film comprises tungsten and oxygen and is formed by sputter deposition along with an energetic ion bombardment from an ion beam at a low pressure less than 2 mTorr while the substrate is biased with a negative voltage which in magnitude is greater than 500 V, wherein the energetic ion bombardment comprises ions with an energy of at least 400 eV, and
    wherein the as-deposited EC film has a pseudo-porous nanostructure with a packing density less than about 85%.

16. The method of claim 15, wherein the EC film, as deposited, is 100-400 nm thick and has a roughness (Rq) of 2.50 nm or greater.

17. The method of claim 15, wherein the EC film comprises 2-3 atomic percent argon.

18. The method of claim 15, wherein the IC layer comprises an electrolyte that facilitates hydrogen ion migration in connection with EC state transitions.

19. The method of claim 15, wherein the IC layer comprises an electrolyte that facilitates lithium ion migration in connection with EC state transitions.

* * * * *